US010204839B2

(12) United States Patent
Hook

(10) Patent No.: US 10,204,839 B2
(45) Date of Patent: Feb. 12, 2019

(54) PREVENTION OF CHARGING DAMAGE IN FULL-DEPLETION DEVICES

(71) Applicant: INTERNATIONAL BUSINESS MACHINES CORPORATION, Armonk, NY (US)

(72) Inventor: Terence B. Hook, Jericho Center, VT (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 78 days.

(21) Appl. No.: 15/597,705

(22) Filed: May 17, 2017

(65) Prior Publication Data
US 2017/0330807 A1 Nov. 16, 2017

Related U.S. Application Data

(62) Division of application No. 15/154,525, filed on May 13, 2016, now Pat. No. 10,002,800.

(51) Int. Cl.
H01L 21/66 (2006.01)
H01L 23/60 (2006.01)
H01L 21/84 (2006.01)
H01L 23/66 (2006.01)
H01L 27/02 (2006.01)
G06F 17/50 (2006.01)

(52) U.S. Cl.
CPC .......... *H01L 22/20* (2013.01); *G06F 17/5081* (2013.01); *H01L 21/84* (2013.01); *H01L 23/60* (2013.01); *H01L 23/66* (2013.01); *H01L 27/0207* (2013.01); *H01L 2223/6677* (2013.01)

(58) Field of Classification Search
None
See application file for complete search history.

(56) References Cited

U.S. PATENT DOCUMENTS

| 7,132,318 | B2 | 11/2006 | Bonges, III et al. |
| 7,470,959 | B2 | 12/2008 | Hook et al. |
| 7,560,345 | B2 | 7/2009 | Hook et al. |
| 7,712,057 | B2 | 5/2010 | Bonges et al. |
| 7,879,650 | B2 | 2/2011 | Hook et al. |
| 8,482,070 | B1 | 7/2013 | Flatresse et al. |

(Continued)

OTHER PUBLICATIONS

List of IBM Patents or Patent Applications Treated as Related dated May 17, 2017, 2 pages.

(Continued)

*Primary Examiner* — Angel Roman
(74) *Attorney, Agent, or Firm* — Tutunjian & Bitetto, P.C.; Vazken Alexanian

(57) ABSTRACT

Methods and systems method for checking a semiconductor device for compliance with a rule include determining whether a fully depleted semiconductor on insulator (FDSOI) device complies with a first design rule that considers antenna area connected to the gate and the source/drain region of the FDSOI device. It is determined whether the FDSOI device complies with a second design rule that considers antenna area connected to the well and the source/drain region of the FDSOI device. The chip layout is modified, if the FDSOI devices fails to comply with the first and second design rules, to bring the non-compliant FDSOI device into compliance.

20 Claims, 4 Drawing Sheets

(56) References Cited

U.S. PATENT DOCUMENTS

| | | | |
|---|---|---|---|
| 8,969,967 | B2 | 3/2015 | Noel et al. |
| 8,980,667 | B2 | 3/2015 | Cai et al. |
| 9,000,840 | B2 | 4/2015 | Thonnart et al. |
| 9,092,590 | B2 | 7/2015 | Giraud et al. |
| 9,219,078 | B2 | 12/2015 | Cheng et al. |
| 9,929,148 | B1* | 3/2018 | Baars ................. H01L 27/0629 |
| 2017/0104005 | A1* | 4/2017 | Haufe ................. H01L 27/1203 |

OTHER PUBLICATIONS

Jeremie Hamon et al., Automatic Leakage Control for Wide Range Performance QDI Asynchronous Circuits in FD-SOI technology, Asynchronous Circuits and Systems (ASYNC), May 2013 IEEE 19th International Symposium on, Santa Monica, CA, 2013, pp. 142-149.

B. Nikolić et al., Circuit Design in Nanoscale FDSOI Technologies, Proc. 29th International Conference on Microelectronics (MIEL 2014), Belgrade, Serbia, May 12-14, 2014.

Jean-Philippe Noel, et al., Multi-VT UTBB FDSOI Device Architectures for Low-Power CMOS Circuit, in IEEE Transactions on Electron Devices, vol. 58, No. 8, pp. 2473-2482, Aug. 2011.

U.S. Appl. No. 14/707,576, filed May 8, 2015.

\* cited by examiner

PREVENTION OF CHARGING DAMAGE IN FULL-DEPLETION DEVICES

BACKGROUND

Technical Field

The present invention generally relates to semiconductor device design and, more particularly, to designing semiconductor devices to prevent charging damage during fabrication.

Description of the Related Art

Plasma induced gate oxide damage is caused during the fabrication of an integrated circuit. Various fabrication processes, in particular those that involve plasmas, can cause a charge buildup on circuit components. This charge buildup results in a voltage being applied to the circuit components that is in excess of the tolerances of those devices. In one specific example, the buildup of charge can cause a breakdown in the gate dielectric of a transistor, thereby damaging the transistor.

Charge builds up in particular on conductors. As the area of conductors increases, for example from component interconnects, the collected charge increases and the higher the likelihood of a breakdown. Conversely, the greater the gate area, for example from multiple devices connected to the interconnect, the more the charge buildup will be spread out and the lower the likelihood of a breakdown.

To address this problem, circuit layouts are checked for compliance with design rules that establish safe margins during fabrication. These rules are referred to as "antenna rules," and a violation of such rules is an "antenna violation." However, in fully depleted semiconductor-on-insulator (SOI) technologies, the channel region and buried dielectric of a device are made particularly thin. While this provides certain advantages in tuning the electrical characteristics of the device (e.g., by applying a voltage to a well underneath the buried dielectric), the use of fully depleted SOI structures creates the risk of plasma induced damage to the buried dielectric as well.

SUMMARY

A system for checking a semiconductor device for compliance with a rule includes a compliance module comprising a processor configured to determine whether a fully depleted semiconductor on insulator (FDSOI) device complies with a first design rule that considers antenna area connected to the gate and the source/drain region of the FDSOI device. The Compliance module is further configured to determine whether the FDSOI device complies with a second design rule that considers antenna area connected to the well and the source/drain region of the FDSOI device. A layout module is configured to modify the chip layout, if the FDSOI devices fails to comply with the first and second design rules, to bring the non-compliant FDSOI device into compliance.

A system for checking a semiconductor device for compliance with a rule includes a compliance module comprising a processor configured to determine one or more device type categories to which a FDSOI device in a chip layout belongs based on which, if any, of a gate, a source/drain region, and a well of the FDSOI device are connected to each other or to a substrate; to determine whether the FDSOI device complies with a first design rule that considers antenna area connected to the gate and the source/drain region of the FDSOI device; and to determine whether the FDSOI device complies with a second design rule that considers antenna area connected to the well and the source/drain region of the FDSOI device. A layout module is configured to modify the chip layout, if the FDSOI devices fails to comply with the first and second design rules, to bring the non-compliant FDSOI device into compliance.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention provide antenna rule compliance checking for semiconductor devices that use fully depleted semiconductor-on-insulator (FDSOI) technologies. In addition to checking antenna rules between the gate and the channel region, to prevent damage to a gate dielectric, the present embodiments check antenna rules between the channel region and an underlying well to prevent damage to a buried dielectric.

The term FDSOI as used herein refers to a semiconductor device that has a narrow semiconductor region forming the channel between a gate dielectric and a buried dielectric. In one exemplary embodiment, the narrow semiconductor region may have a thickness of about 7 nm. As a result, the field exerted by the gate of a transistor can fully deplete the channel region of charge carriers (i.e., electrons in an n-type region and "holes" in a p-type region).

Figure 1:
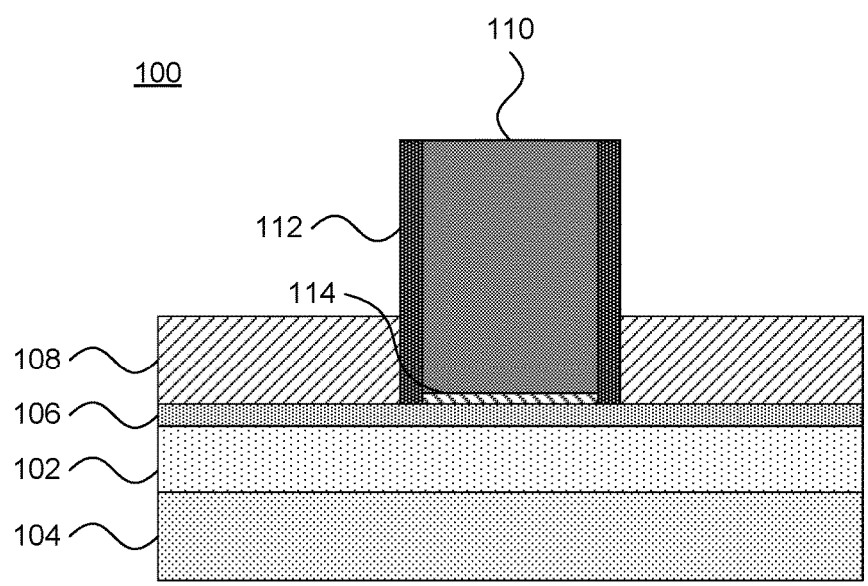
FIG. 1 is a diagram of a fully depleted semiconductor on insulator (FDSOI) device in accordance with the present principles.

Referring now to FIG. 1, an exemplary FDSOI device 100 is shown. A thin semiconductor layer 106 is on a buried insulator layer 102. In one specific embodiment, the buried insulator layer 102 may be an oxide such as silicon dioxide, and the semiconductor layer 106 may be a silicon-containing material. The thin semiconductor layer 106 may have an exemplary thickness of about 7 nm, while the buried insulator layer 102 may have an exemplary thickness of about 25 nm. Illustrative examples of silicon-containing materials suitable for the semiconductor substrate 106 include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride and zinc sellenide.

Underneath the buried insulator layer 102, or formed therein, is one or more wells 104. In one exemplary embodiment, the well 104 may be an n-doped semiconductor region. In an alternative embodiment, the well 104 may be a triple well that includes a p-doped region within an n-doped region, surrounded by an intrinsic semiconductor substrate. As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor In a silicon containing substrate examples of n-type dopants, i.e., impurities, include but are not limited to antimony, arsenic and phosphorous.

The thin semiconductor layer 106 forms the channel region of the device 100. Source and drain regions 108 may be formed directly on the thin semiconductor layer 106 and may be appropriately doped. The source and drain regions 108 may be formed from the same material as the thin semiconductor layer 106 and later doped by implantation or, alternatively, may be epitaxially grown and doped in situ. A gate 110 is formed over the channel region of the thin semiconductor layer 106, with spacers 112 to electrically insulate the gate 110 from the source and drain regions 108. A gate dielectric layer 114 insulates the channel region of the thin semiconductor layer 106 from the gate 110.

It should be understood that the FDSOI device 100 may be considered alone or in tandem with a large set of other FDSOI devices and other types of device on a single chip. Multiple FDSOI devices 100 may be connected to a single net on the design layout of the chip and so may be connected to one another via, e.g., one another's gates 110, source/drain regions 108, and wells 104. Such a chip may be fabricated according to any appropriate semiconductor device fabrication process at any appropriate scale.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

During fabrication, some processes tend to cause the accumulation of stray charge on conducting circuit components. For example, contacts and interconnects can act like antennas that accumulate the charge. When the accumulated charge grows too large to be dissipated safely, an insulating layer (such as the gate dielectric 114 or the buried dielectric layer 102) can break down, damaging the device.

To account for this, design rules are used to compare the amount of antenna area to an amount of dissipating area (e.g., gate area). However, the presence of well 104 complicates matters, as there are multiple avenues for breakdown and, furthermore, the well and the gate interact with one another to potentially increase the likelihood of breakdown in certain conditions. As a result, the FDSOI device 100 can be interpreted as two separate systems: a gate-system that characterizes the danger of charging damage to the gate dielectric 114 between the gate 110 and the thin semiconductor layer 106, and a well-system that characterizes the danger of charging damage to the buried dielectric 102 between the thin semiconductor layer 106 and the well 104.

In particular, the gate 110, the source/drain regions 108 (and thus also the thin semiconductor layer 106), and the well 104 may each have respective antennas (i.e., networks of conductive material) connected to them. The device 100 can be modeled as two separate transistor structures for antenna rule compliance—with a first rule checking for compliance between the gate and the source/drain potentials and a second rule checking for compliance between the well and the source/drain potentials.

When assessing the gate-system for compliance, the worst-case scenario is if the well 104 is effectively grounded to the substrate. In some embodiments the well 104 may accumulate a charge of its own, but such a charge would serve to diminish the danger of the charge buildup on the gate 110. Because checking for antenna rule compliance is intended to ensure safe processes, the worst-case scenario is assumed. In this case, there are three possibilities: both the gate 110 and the source/drain regions 108 may float relative to the well 104, the gate 110 may be tied to the well 104, or the source/drain regions 108 may be tied to the well 104 (e.g., through one or more interconnects or devices). If both nodes are floating, the likelihood of damage is significantly smaller than if one node is effectively grounded, as balanced charge buildups will produce a smaller potential difference than if one node is kept at a ground potential.

When assessing the well-system for compliance, the gate 110 is ignored. If the well 104 has a floating potential (e.g., in the case of an n-well or triple well), then the antenna size of both the well 104 and the source/drain regions 108 should be limited. If the well 104 is grounded to the substrate, then the antenna on the source/drain regions 108 are limited. As with the gate-system, if both nodes are floating, the buried insulator layer 102 is less likely to be damaged, because the potential difference between the nodes will be smaller than if one node is grounded.

It should be noted that, if the source/drain regions 108 are electrically connected to the well 104 (i.e., if they are on the same net) then there is no need to test for rule compliance for the well-system, as there is no likelihood of damage to the dielectric between them. Similarly, if the gate 110 and the source/drain regions 108 are electrically connected to one another, compliance checking for the gate-system may be skipped as well.

When checking for antenna rule compliance, the device 100 is determined to fall into one or more of the categories described above and an appropriate set of antenna rules is applied. In a first example, where neither the gate 110 nor the source/drain regions 108 are electrically connected to the well 104 or the substrate, then a first exemplary antenna rule is to ensure that $$\frac{1}{1/V_g} + \frac{1}{1/V_{sd}} < \alpha A_g,$$

where $V_g$ is the antenna area connected to gate 110, $V_{sd}$ is the antenna area connected to the source/drain regions 108, $A_g$ is the area of gate 110, and $\alpha$ is a technology-specific factor related to the ability of the gate dielectric 114 to harmlessly support charging current.

In a second example, where neither the source/drain 108 nor the well 104 are electrically connected to the substrate, then a second exemplary antenna rule is to ensure that $$\frac{1}{1/V_{well}} + \frac{1}{1/V_{sd}} < \beta A_g,$$

where $V_{well}$ is the antenna area connected to the well 104 and $\beta$ is a technology-specific factor related to the ability of the buried dielectric 102 to harmlessly support charging current.

In a third example, if the gate 110 is electrically connected to the well 104 or the substrate, then a third exemplary antenna rule is to ensure that $$V_{sd} < \frac{\alpha A_g}{10}.$$

Because the gate 110 is connected to the well 104 or the substrate and, in the worst case scenario, is assumed therefore to be grounded, the tolerance to charge buildup is much lower (in this specific example by a factor of ten).

In a fourth example, if the source/drain regions 106 are electrically connected to the well 104 or the substrate, then a fourth exemplary antenna rule is to ensure that $$V_g < \frac{\alpha A_g}{10}.$$

As with the scenario described above, the fact that one node is connected to the well 104 or the substrate (and must therefore be assumed to be at a ground potential), the tolerance for charge buildup is decreased.

In a fifth example, if the well 104 is electrically connected to the substrate, then a fifth exemplary antenna rule is to ensure that $$V_{sd} < \frac{\beta A_g}{10}.$$

In this case, the antenna rule is checking for compliance between the well 104 and the source/drain region 108, ignoring the gate 110.

In a sixth example, if the source/drain regions 108 are electrically connected to the substrate, the a sixth exemplary antenna rule is to ensure that $$V_{well} < \frac{\beta A_g}{10}.$$

Figure 2:
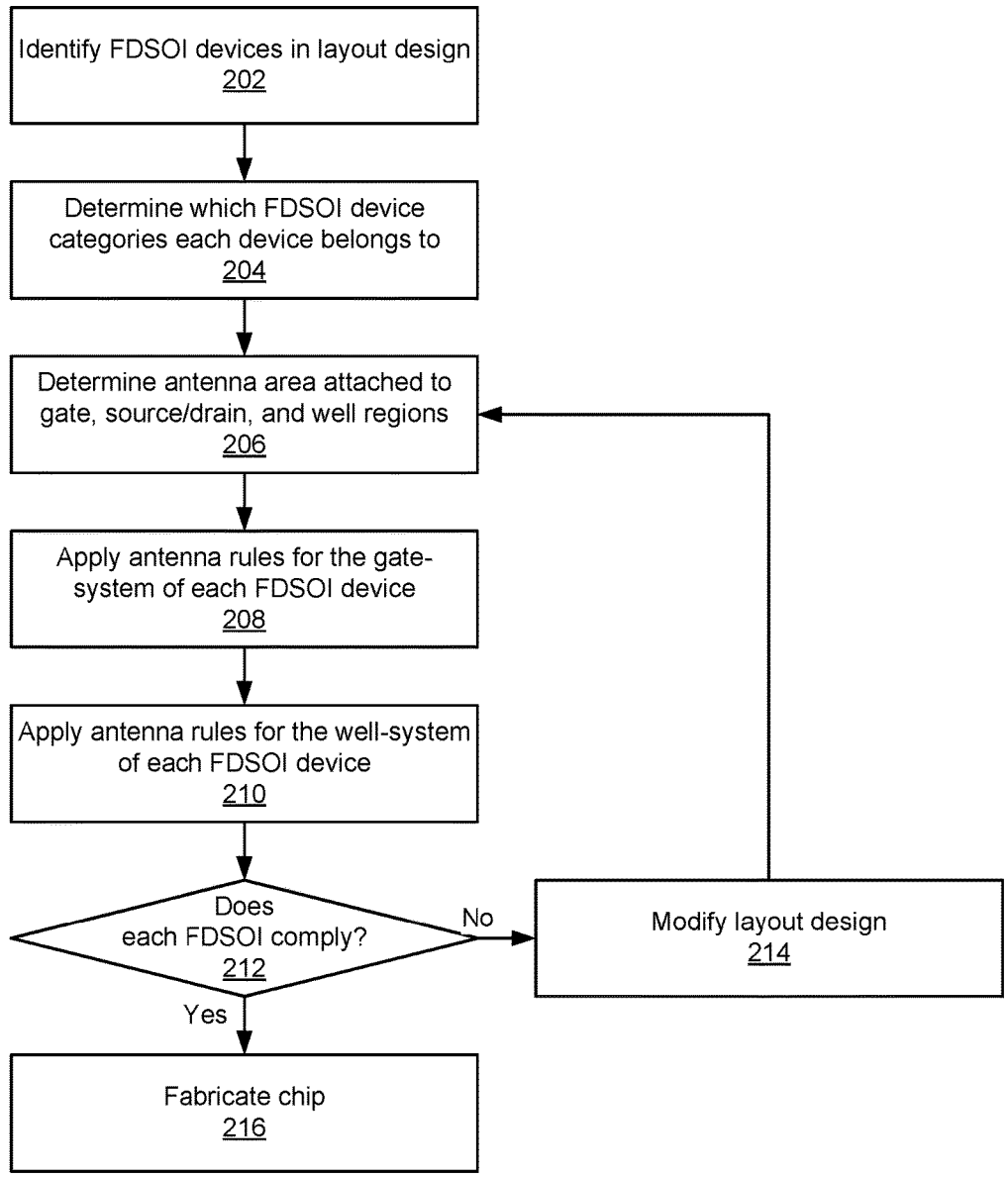
FIG. 2 is a block/flow diagram of a method of checking a gate-system and a well-system of an FDSOI device for compliance with antenna rules in accordance with the present principles.

Referring now to FIG. 2, a method of preventing charging damage is shown. Block 202 identifies the FDSOI devices 100 on a design layout that have an underlying well 104. Block 204 then determines which category of device each FDSOI device 100 belongs to, based on whether there are connections between the gate 110, the source/drain regions 108, and the well 104, and whether the well 104 is electrically to the substrate or ground.

Block 206 determines an antenna area that is attached to the gate 110, the source/drain regions 108, and the well 104 of each FDSOI device 100. The antenna area may include metal interconnects and contacts and may also include other conductive structures. Block 208 then applies an antenna rule for the gate-system of each FDSOI device 100, determining whether there is a likelihood of damage at the gate dielectric 114 due to charge buildup at the gate 110 or the source/drain regions 108. As noted above, the antenna rule to be applied by block 208 depends on which category of device the FDSOI device 100 is determined to be. Block 210 similarly applies an antenna rule for the well-system of each FDSOI device 100, determining whether there is a likelihood of damage at the buried dielectric 102 due to charge buildup at the well 104 or the source/drain regions 108. Again, the specific antenna rule to be applied depends on which category of device the FDSOI device 100 belongs to.

Block 212 determines whether each FDSOI device 100 complies with its respective antenna rules. If not, block 214 modifies the layout design. Block 214 may be performed by a human being using a computer-assisted design tool or, alternatively, modifications to the design layout may be made automatically to, e.g., decrease the amount of antenna area for a particular node or to increase the safe discharge area. Processing returns to block 206 and antenna checks are repeated until every FDSOI device 100 complies. Once all FDSOI devices 100 have been checked and all compliance violations have been resolved, block 216 fabricates the chip.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 3:
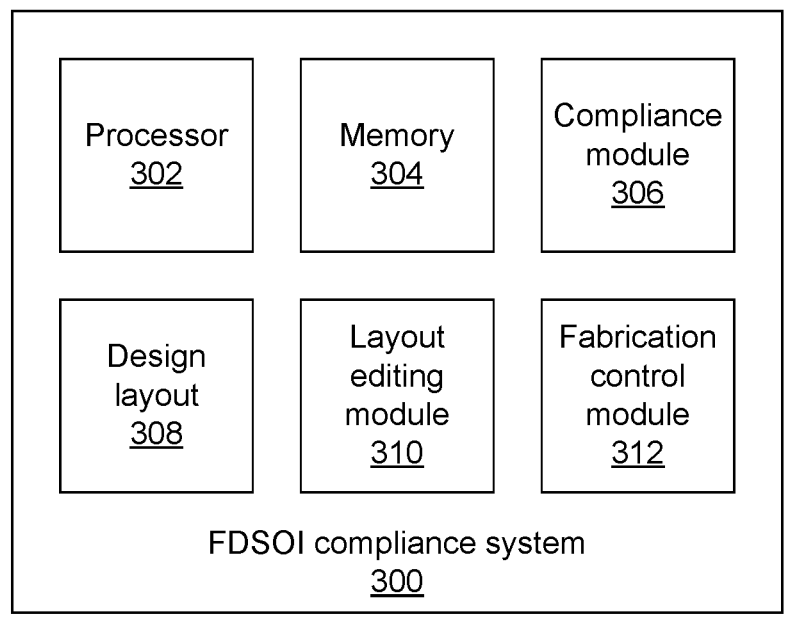
FIG. 3 is a block diagram of a system for checking a gate-system and a well-system of an FDSOI device for compliance with antenna rules in accordance with the present principles.

Referring now to FIG. 3, a system 300 for ensuring compliance of an FDSOI device with one or more rules is shown. The system 300 includes a hardware processor 302 and a memory 304. In addition, the system 300 may include one or more functional modules that are implemented as software, stored in memory 304 and executed by processor 302. Alternatively, the functional modules may be implemented as one or more discrete hardware components using, e.g., application specific integrated chips or field programmable gate arrays.

For example, compliance module 306 analyzes a design layout 308 that is stored in memory 304 and determines whether the design layout complies with one or more antenna rules. To accomplish this, the compliance module determines the area of nets in the design layout 308 connected to respective nodes in each FDSOI device 100 and checks each FDSOI device 100 against at least two antenna compliance rules—one for the gate-system and one for the well-system in FDSOI device 100.

If at least one FDSOI device 100 in the design layout 308 fails to comply with the antenna rules, layout editing module 310 is used to make modifications to the design layout 308 to bring the FDSOI devices 100 into compliance. This may be performed automatically or with guidance from a human designer. Once the compliance module 306 confirms that all FDSOI devices 100 comply with the antenna rules, block 312 controls fabrication of the chip.

Figure 4:
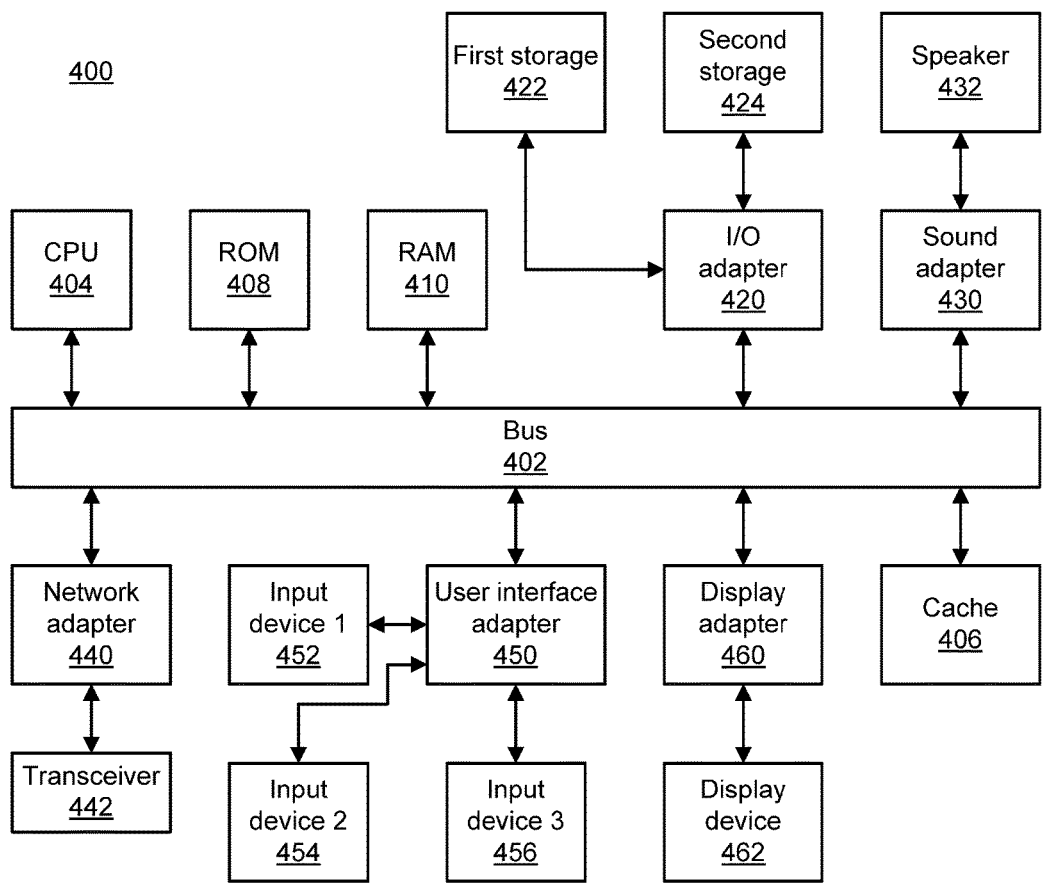
FIG. 4 is is a block diagram of a processing system in accordance with the present principles.

Referring now to FIG. 4, an exemplary processing system 400 is shown which may represent the system 300 for ensuring compliance of an FDSOI device with one or more rules. The processing system 400 includes at least one processor (CPU) 404 operatively coupled to other components via a system bus 402. A cache 406, a Read Only Memory (ROM) 408, a Random Access Memory (RAM) 410, an input/output (I/O) adapter 420, a sound adapter 430, a network adapter 440, a user interface adapter 450, and a display adapter 460, are operatively coupled to the system bus 402.

A first storage device 422 and a second storage device 424 are operatively coupled to system bus 402 by the I/O adapter 420. The storage devices 422 and 424 can be any of a disk storage device (e.g., a magnetic or optical disk storage device), a solid state magnetic device, and so forth. The storage devices 422 and 424 can be the same type of storage device or different types of storage devices.

A speaker 432 is operatively coupled to system bus 402 by the sound adapter 430. A transceiver 442 is operatively coupled to system bus 402 by network adapter 440. A display device 462 is operatively coupled to system bus 402 by display adapter 460.

A first user input device 452, a second user input device 454, and a third user input device 456 are operatively coupled to system bus 402 by user interface adapter 450. The user input devices 452, 454, and 456 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input devices 452, 454, and 456 can be the same type of user input device or different types of user input devices. The user input devices 452, 454, and 456 are used to input and output information to and from system 400.

Of course, the processing system 400 may also include other elements (not shown), as readily contemplated by one of skill in the art, as well as omit certain elements. For example, various other input devices and/or output devices can be included in processing system 400, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 400 are readily contemplated by one of ordinary skill in the art given the teachings of the present principles provided herein.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A system for checking a semiconductor device for compliance with a rule, comprising:
   a compliance module comprising a processor configured to determine whether a fully depleted semiconductor on insulator (FDSOI) device complies with a first design rule that considers antenna area connected to the gate and the source/drain region of the FDSOI device; and to determine whether the FDSOI device complies with a second design rule that considers antenna area connected to the well and the source/drain region of the FDSOI device; and
   a layout module configured to modify the chip layout, if the FDSOI devices fails to comply with the first and second design rules, to bring the non-compliant FDSOI device into compliance.

2. The system of claim 1, wherein the compliance module and the layout module are further configured to repeat the compliance checks and the chip layout modification until every FDSOI device in a chip layout complies with the first and second design rules.

3. The system of claim 1, further comprising a fabrication control module configured to fabricate a chip based on the chip layout after determining every FDSOI device in the chip layout complies with the first and second design rules.

4. The system of claim 1, wherein the compliance module is further configured to determine one or more device type categories to which a fully depleted semiconductor on insulator (FDSOI) device in a chip layout belongs based on which, if any, of a gate, a source/drain region, and a well of the FDSOI device are connected to each other or to a substrate.

5. The system of claim 4, wherein the FDSOI device is determined to be in a first category if neither the gate nor the source/drain region is electrically connected to the well or the substrate.

6. The system of claim 5, wherein the first design rule compares a combined antenna area electrically connected to the gate and the source/drain region to an area of the gate times a safe charging current factor for a gate dielectric.

7. The system of claim 5, wherein the second design rule compares a combined antenna area electrically connected to the well and to the source/drain region to an area of the gate times a safe charging current factor for a buried dielectric.

8. The system of claim 4, wherein the FDSOI device is determined to be in a second category if the gate is electrically connected to the well or the substrate.

9. The system of claim 8, wherein the first design rule compares an antenna area electrically connected to the source/drain region to an area of the gate times a safe charging current factor for a gate dielectric divided by a factor of ten.

10. The system of claim 4, wherein the FDSOI device is determined to be in a third category if the source/drain region is electrically connected to the well or the substrate.

11. The system of claim 10, wherein the first design rule compares an antenna area electrically connected to the gate to an area of the gate times a safe charging current factor for a gate dielectric divided by a factor of ten.

12. The system of claim 4, wherein the FDSOI device is determined to be in a fourth category if the well is electrically connected to a substrate.

13. The system of claim 12, wherein the second design rule compares an antenna area electrically connected to the source/drain region to an area of the source/drain region times a safe charging current factor for a buried dielectric divided by a factor of ten.

14. The system of claim 4, wherein the FDSOI device is determined to be in a fifth category if the source/drain region is electrically connected to the well or the substrate.

15. The system of claim 14, wherein the second design rule compares an antenna area electrically connected to the well to an area of the source/drain region times a safe charging current factor for a buried dielectric divided by a factor of ten.

16. A system for checking a semiconductor device for compliance with a rule, comprising:
a compliance module comprising a processor configured to determine one or more device type categories to which a fully depleted semiconductor on insulator (FDSOI) device in a chip layout belongs based on which, if any, of a gate, a source/drain region, and a well of the FDSOI device are connected to each other or to a substrate; to determine whether the FDSOI device complies with a first design rule that considers antenna area connected to the gate and the source/drain region of the FDSOI device; and to determine whether the FDSOI device complies with a second design rule that considers antenna area connected to the well and the source/drain region of the FDSOI device; and
a layout module configured to modify the chip layout, if the FDSOI devices fails to comply with the first and second design rules, to bring the non-compliant FDSOI device into compliance.

17. The system of claim 16, wherein the compliance module and the layout module are further configured to repeat the compliance checks and the chip layout modification until every FDSOI device in a chip layout complies with the first and second design rules.

18. The system of claim 16, further comprising a fabrication control module configured to fabricate a chip based on the chip layout after determining every FDSOI device in the chip layout complies with the first and second design rules.

19. The system of claim 16, wherein the FDSOI device is determined to be in a first category if neither the gate nor the source/drain region is electrically connected to the well or the substrate, in a second category if the gate is electrically connected to the well or the substrate, in a third category if the source/drain region is electrically connected to the well or the substrate, in a fourth category if the well is electrically connected to a substrate, and in a fifth category if the source/drain region is electrically connected to the well or the substrate.

20. The system of claim 19, wherein the first rule and second rule are selected in accordance with a device type category.

* * * * *